US009601327B2

(12) United States Patent
McCann

(10) Patent No.: US 9,601,327 B2
(45) Date of Patent: Mar. 21, 2017

(54) HIGH-POWER ELECTRONIC DEVICE PACKAGES AND METHODS

(71) Applicant: Board of Regents University of Oklahoma, Norman, OK (US)

(72) Inventor: Patrick J. McCann, Norman, OK (US)

(73) Assignee: The Board of Regents of the University of Oklahoma, Norman, OK (US)

(*) Notice: Subject to any disclaimer, the term of this patent is extended or adjusted under 35 U.S.C. 154(b) by 0 days.

(21) Appl. No.: 14/827,946

(22) Filed: Aug. 17, 2015

(65) Prior Publication Data

US 2016/0049351 A1 Feb. 18, 2016

Related U.S. Application Data

(60) Provisional application No. 62/038,037, filed on Aug. 15, 2014.

(51) Int. Cl.
*H01L 23/373* (2006.01)
*H01L 21/02* (2006.01)
(Continued)

(52) U.S. Cl.
CPC .... *H01L 21/02488* (2013.01); *H01L 21/0254* (2013.01); *H01L 21/02485* (2013.01); *H01L 21/02505* (2013.01); *H01L 21/6835* (2013.01); *H01L 23/3732* (2013.01); *H01L 23/3736* (2013.01); *H01L 23/3737* (2013.01);
(Continued)

(58) Field of Classification Search
CPC ......... H01L 21/02485; H01L 21/02488; H01L 21/02505; H01L 21/0254; H01L 21/6835; H01L 23/3675; H01L 23/3732; H01L 23/3735; H01L 23/3736; H01L 23/3737; H01L 23/481; H01L 23/492; H01L 24/27;
(Continued)

(56) References Cited

U.S. PATENT DOCUMENTS 6,071,795 A 6/2000 Cheung et al.
6,420,242 B1 7/2002 Cheung et al.
(Continued)

OTHER PUBLICATIONS

Sarua, A., et al., "Integrated Micro-Raman/Infrared Thermography Probe for Monitoring of Self-Heating in AlGaN/GaN Transistor Structures," IEEE Transactions on Electron Devices, vol. 53, No. 10, Oct. 2006, pp. 2438-2447.
(Continued)

*Primary Examiner* — Eric Ward
(74) *Attorney, Agent, or Firm* — Conley Rose, P.C.; Grant Rodolph; Jonathan K. Polk

(57) ABSTRACT

A high power electronic device package constructed to include a high power electronic device having an epitaxial surface attached to a thermally conductive submount by a thermally conductive interface layer having a eutectic metal contact therein. A gallium nitride high electron mobility transistor (GaN HEMT) having a transistor structure formed of a GaN thin film layer bonded to a thermally conductive host substrate via a thermally conductive interface layer disposed therebetween, and a method of forming the GaN HEMT. The GaN HEMTs can be used in such applications as, for example, power amplifiers with x-band radio frequency (RF) power outputs for micro-radar applications.

13 Claims, 10 Drawing Sheets

(51) Int. Cl.
*H01L 23/00* (2006.01)
*H01L 21/683* (2006.01)
*H01L 29/778* (2006.01)
*H01L 29/20* (2006.01)

(52) U.S. Cl.
CPC .............. *H01L 24/27* (2013.01); *H01L 24/32* (2013.01); *H01L 24/83* (2013.01); *H01L 23/3735* (2013.01); *H01L 29/2003* (2013.01); *H01L 29/778* (2013.01); *H01L 2221/6835* (2013.01); *H01L 2221/68368* (2013.01); *H01L 2221/68381* (2013.01); *H01L 2224/2919* (2013.01); *H01L 2224/29191* (2013.01); *H01L 2224/32245* (2013.01); *H01L 2224/32502* (2013.01); *H01L 2224/83191* (2013.01); *H01L 2924/01004* (2013.01); *H01L 2924/01013* (2013.01); *H01L 2924/01029* (2013.01); *H01L 2924/01042* (2013.01); *H01L 2924/01047* (2013.01); *H01L 2924/01074* (2013.01); *H01L 2924/0532* (2013.01); *H01L 2924/05032* (2013.01); *H01L 2924/05432* (2013.01); *H01L 2924/06* (2013.01); *H01L 2924/07025* (2013.01); *H01L 2924/1033* (2013.01); *H01L 2924/1304* (2013.01); *H01L 2924/13055* (2013.01); *H01L 2924/13064* (2013.01); *H01L 2924/13091* (2013.01); *H01L 2924/1423* (2013.01)

(58) Field of Classification Search
CPC ..... H01L 24/32; H01L 24/83; H01L 29/2003; H01L 29/778
See application file for complete search history.

(56) References Cited

U.S. PATENT DOCUMENTS

| | | | | |
|---|---|---|---|---|
| 6,738,253 | B2* | 5/2004 | Beuille | H01L 23/367 |
| | | | | 257/678 |
| 6,987,318 | B2* | 1/2006 | Sung | H01L 23/373 |
| | | | | 257/720 |
| 7,595,507 | B2 | 9/2009 | Francis et al. | |
| 7,943,485 | B2 | 5/2011 | Francis et al. | |
| 8,519,506 | B2* | 8/2013 | Hopper | H01L 23/147 |
| | | | | 257/446 |
| 2003/0183368 | A1* | 10/2003 | Paradis | F28F 3/04 |
| | | | | 165/80.3 |
| 2006/0266280 | A1 | 11/2006 | Francis et al. | |
| 2008/0298021 | A1* | 12/2008 | Ali | H01L 23/3732 |
| | | | | 361/705 |

OTHER PUBLICATIONS

Jeffers, J., et al., "Cross-plane thermal conductivity of a PbSnSe/PbSe superlattice material," Applied Physics Letters 99, Jul. 27, 2011, 3 pages.

Tang, X., et al., "Thermal behavior analysis of GaN based epi-material on different substrates by means of a physical-thermal model," Physica Status Solidi A, vol. 207, No. 8, Aug. 2010, pp. 1820-1826.

Das, J., et al., "Substrate removal of AlGaN/GaN HEMTs using laser lift-off," Physica Status Solidi (C), vol. 2, No. 7, May 2005, pp. 2655-2658.

Chan, C.P., "DC characterization of laser-debonded GaN HEMTs," Physica Status Solidi (a), vol. 204, No. 3, Mar. 2007, pp. 914-922.

Ji, H., et al., "Laser lift-off trasfer of AlGaN/GaN HEMTs from sapphire onto Si: A thermal perspective," Solid-State Electronics, vol. 53, No. 5, May 2009, pp. 526-529.

Trejo, M., et al., "Progress towards III-nitrides HEMTs on free-standing diamond substrates for thermal management," Physica Status Solidi A, vol. 208, No. 2, Feb. 2011, pp. 439-444.

Wu, H., et al., "Molecular beam epitaxy growth of PbSe on BaF2-coated Si(111) and observation of the PbSe growth interface," Journal of Vacuum Science & Technology B Microelectronics and Nanometer Structures, vol. 17, No. 3, May/Jun. 1999, pp. 1263-1266.

Li, Y., et al., "Improvement in Heat Dissipation by Transfer of IV-VI Epilayers From Silicon to Copper," IEEE Photonics Technology Letters, vol. 16, No. 11, Nov. 2004, pp. 2433-2435.

Li, Y.F., et al., "Transfer of IV-VI multiple quantum well structures grown by molecular beam epitaxy from Si substrates to copper," Elsevier, Thin Solid Films, vol. 488, No. 1-2, Sep. 2005, pp. 178-184.

Shen, L., et al., "High performance deeply-recessed GaN power HEMTs without surface passivation," Electronics Letters, vol. 42, No. 9, Apr. 27, 2006, 2 pages.

Stankovic, S., et al., "Die-to-Die Adhesive Bonding Procedure for Evanescently-Coupled Photonic Devices," Electrochemical and Solid-State Letters, vol. 14, No. 8, May 16, 2011, pp. H326-H329.

Kim, H., et al., "Characterization of Low-Temperature Wafer Bonding Using Thin Film Parylene," Journal of Microelectromechanical Systems, vol. 14, No. 6, Dec. 2005, pp. 1347-1355.

Ohta, J., et al., "Growth of group III nitride films by pulsed electron beam deposition," Journal of Solid State Chemistry, vol. 182, No. 5, May 2009, pp. 1241-1244.

Muller, P., et al., "Reduction of Threading Dislocation Densities in Heavily Lattice Mismatched PbSe on Si(111) by Glide," Physical Review Letters, vol. 78, No. 15, Apr. 14, 1997, 4 pages.

* cited by examiner

HIGH-POWER ELECTRONIC DEVICE PACKAGES AND METHODS

CROSS-REFERENCE TO RELATED APPLICATIONS

This application claims priority to co-pending U.S. Provisional Application No. 62/038,037 filed Aug. 15, 2014 by Board of Regents University of Oklahoma and titled "Packaging High Power Electronic Devices," the entirety of which is incorporated herein by reference.

BACKGROUND

Transistors fabricated from semiconductor materials have a phenomenal track record in the relatively short history of microelectronics technology development. Although initial work on solid state transistors in the early 1950s focused on radar proximity fuse applications, this motivation gave way quickly to their use in digital electronics. Silicon-based metal oxide semiconductor field-effect transistor (MOSFET) technology is now a $300 billion per year business that enables affordable consumer adoption of life-changing information technology products (e.g., cell phones, computers, the Internet). At their most basic principle of operation, transistors control the flow of electrical current. Silicon complementary metal oxide semiconductor (CMOS) technology works by allowing the flow of small amounts of current pulses that represent binary data. MOSFETs, however, are not suitable for high-power microwave and high-power electronics applications because of low channel electron mobility and low breakdown voltages. Extending transistor operation to allow the flow of large amounts of current for high-power applications requires a different semiconductor materials technology. Recently, a new semi-conductor material, gallium nitride (GaN), has emerged as an option for high-power applications.

GaN transistors are currently made from thin films of GaN material grown on substrates such as sapphire, silicon, or silicon carbide (SiC). High-electron-mobility transistors (HEMTs) made from $Al_{1-x}Ga_xN/GaN$ heterostructures are grown primarily by metal organic chemical vapor deposition (MOCVD) crystal growth techniques. Transistor structures with power added efficiencies of greater than 50% in microwave power amplifier applications have been demonstrated with all three growth substrate materials. However, SiC has higher thermal conductivity than sapphire and silicon. GaN HEMT on SiC technology is sufficiently developed so that commercial suppliers are now providing power amplifiers with x-band radio frequency (RF) power outputs in the range of 10 watts, which is sufficient for micro-radar applications. The pricing for these GaN HEMT products, however, is much higher than for equivalent GaN-based devices grown on sapphire or silicon due to the significantly higher costs for SiC growth substrates. Moreover, GaN growth on SiC requires a thin layer of aluminum nitride (AlN) for good epitaxy. Although GaN HEMTs on SiC growth substrates exhibit increased high-power performance as compared to devices fabricated on sapphire or silicon, a thermal boundary layer is associated with the thin AlN buffer layer material. The effective thermal conductivity of this layer can be as low as 2.2 watts per meter Kelvin (W/mK), which is more than 160 times smaller than the 360 W/mK thermal conductivity of SiC. Even though the AlN nucleation layer is thin, about 40 nanometers (nm), it contributes to significant additional heating of the GaN transistor material under high current operating conditions. Thin layers of such materials are known to cause large reductions in cross-plane thermal conductivity values due to phonon scattering or phonon reduction effects. Since GaN growth on SiC requires a thin AlN layer for good epitaxy, this thermal boundary property of the AlN layer stands as a major problem for the commercial viability of such GaN HEMTs fabricated with SiC growth substrates.

Silicon-based insulated gate bipolar junction transistors (IGBTs), a more than 20-year-old technology, are currently the incumbent technology for most high-power electronics applications. For example, hybrid and plug-in electric vehicles rely on Si IGBT modules for direct current (DC)-to-DC boost conversion and DC-to-alternating current (AC) inversion for driving electric traction motors. The relatively small bandgap energy of silicon limits the boosted voltage range to 600 volts or less. By contrast, larger bandgap GaN transistors have breakdown fields that are 10× larger than those of silicon. In addition, the on resistance values for GaN HEMTs are typically 10× smaller than those of silicon. These parameters can be used to estimate the reduction in the waste heat generated in power electronics modules when Si IGBTs are replaced with more advanced device technologies. A doubling of the motor voltage from 500 volts to 1,000 volts and reduction of transistor on resistance from a typical 0.200 ohms to 0.020 ohms would reduce Joule heating (where the power converted from electrical energy to thermal energy is equal to the square of the current traveling through an element times the resistance of the element) by a factor of 40. In such a case, rather than generating 1 kilowatt (kW) or more of waste heat, and thus contributing significantly to high inefficiencies and requirements for water cooling, a more advanced power electronics module could generate about 25 watts of waste heat, which could be low enough to allow passive convective air cooling. An additional benefit of GaN HEMTs is their ability to be switched at much higher frequencies than Si IGBTs. This allows significant reductions in the size of passive components such as capacitors, reduces wear on motor bearings, and further improves efficiency. However, these advances have previously been achieved, and it is to such advanced power electronics modules that the presently disclosed concepts are directed.

BRIEF DESCRIPTION OF THE DRAWINGS

Several embodiments of the presently disclosed concepts are hereby illustrated in the appended drawings. It is to be noted however, that the appended drawings only illustrate several typical embodiments and are therefore not intended to be considered limiting of the scope of the presently disclosed concepts. Further, in the appended drawings, like or identical reference numerals may be used to identify common or similar elements and not all such elements may be so numbered. The figures are not necessarily to scale and certain features and certain views of the figures may be shown as exaggerated in scale or in schematic in the interest of clarity and conciseness.

DETAILED DESCRIPTION

Figure 1:
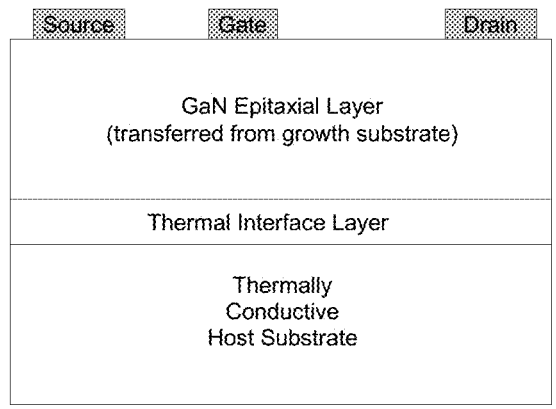
FIG. 1 is a cross-sectional view of a GaN HEMT device constructed in accordance with the presently disclosed concepts.

Before explaining at least one embodiment of the presently disclosed and claimed concepts in detail by way of exemplary description, drawings, experimentation, and results, it is to be understood that the concepts are not limited in their application to the details of construction and the arrangement of the compositions, formulations, steps, or components set forth in the following description or illustrated in the drawings, examples, experiments, and/or results. The presently disclosed inventive concepts are capable of other embodiments or of being practiced or carried out in various ways. As such, the language used herein is intended to be given the broadest possible scope and meaning, and the embodiments are meant to be exemplary, not exhaustive. In addition, it is to be understood that the phraseology and terminology employed herein is for the purpose of description and should not be regarded as limiting except where indicated as such.

Unless otherwise defined herein, scientific and technical terms used in connection with the presently disclosed concepts shall have the meanings that are commonly understood by those of ordinary skill in the art. Further, unless otherwise required by context, singular terms shall include pluralities and plural terms shall include the singular. The nomenclatures utilized in connection with, and the laboratory procedures and techniques of, analytical chemistry, and semiconductor production described herein are those well known and commonly used in the art.

All patents, published patent applications, and non-patent publications mentioned in the specification are indicative of the level of skill of those skilled in the art to which these presently disclosed and claimed concepts pertain. All patents, published patent applications, and non-patent publications referenced in any portion of this application are herein expressly incorporated by reference in their entirety to the same extent as if each individual patent or publication was specifically and individually indicated to be incorporated by reference.

All of the compositions, devices, and/or methods disclosed herein can be made and executed without undue experimentation in light of the present disclosure. While the compositions, devices and methods of these presently disclosed concepts have been described in terms of particular examples and embodiments, it will be apparent to those of skill in the art that variations may be applied to the devices, compositions, and/or methods and in the steps or in the sequence of steps of the method described herein without departing from the concept, spirit, and scope of the presently disclosed inventive concepts. All such similar substitutes and modifications apparent to those skilled in the art are deemed to be within the spirit, scope, and concept of the concepts as defined by the appended claims.

As utilized in accordance with the present disclosure, the following terms, unless otherwise indicated, shall be understood to have the following meanings: The use of the word "a" or "an" when used in conjunction with the term "comprising" in the claims and/or the specification may mean "one," but it is also consistent with the meaning of "one or more," "at least one," and "one or more than one." The use of the term "or" in the claims is used to mean "and/or" unless explicitly indicated to refer to alternatives only or the alternatives are mutually exclusive, although the disclosure supports a definition that refers to only alternatives and "and/or." Throughout this application, the term "about" is used to indicate that a value includes the inherent variation or error for the device, the method being employed to determine the value, or the variation that exists among the study subjects. For example but not by way of limitation, when the term "about" is utilized, the designated value may vary by plus or minus twelve percent, or eleven percent, or ten percent, or nine percent, or eight percent, or seven percent, or six percent, or five percent, or four percent, or three percent, or two percent, or one percent, or one-half percent. The term "substantially" will be understood to allow for minor variations and/or deviations that do not result in a significant impact thereto.

The use of the term "at least one" will be understood to include one as well as any quantity more than one, including but not limited to, 2, 3, 4, 5, 6, 7, 8, 9, 10, 11, 12, 13, 14, 15, 16, 17, 18, 19, 20, 21, 22, 23, 24, 25, 30, 35, 40, 45, 50, 55, 60, 65, 70, 75, 80, 85, 90, 95, 100, or more. The term "at least one" may extend up to 500 or 1000 or more, depending on the term to which it is attached; in addition, the quantities of 500/1000 are not to be considered limiting, as higher limits may also produce satisfactory results. In addition, the use of the term "at least one of X, Y, and Z" will be understood to include X alone, Y alone, and Z alone, as well as any combination of X, Y, and Z. The use of ordinal number terminology (i.e., "first," "second," "third," "fourth," etc.) is solely for the purpose of differentiating between two or more items and is not meant to imply any sequence, order, or importance to one item over another or any order of addition, for example.

As used in this specification and claims, the words "comprising" (and any form of comprising, such as "comprise" and "comprises"), "having" (and any form of having, such as "have" and "has"), "including" (and any form of including, such as "includes" and "include") or "containing" (and any form of containing, such as "contains" and "contain") are inclusive or open-ended and do not exclude additional, un-recited elements or method steps.

The phrase "or combinations thereof" as used herein refers to all permutations and combinations of the listed items preceding the term. For example, "A, B, C, or combinations thereof" is intended to include at least one of: A, B, C, AB, AC, BC, or ABC, and if order is important in a particular context, also BA, CA, CB, CBA, BCA, ACB, BAC, or CAB. Continuing with this example, expressly included are combinations that contain repeats of one or more item or term, such as BB, AAA, AAB, BBC, AAAB-CCCC, CBBAAA, CABABB, and so forth. The skilled artisan will understand that typically there is no limit on the number of items or terms in any combination, unless otherwise apparent from the context.

As used herein, the term "substantially" means that the subsequently described event or circumstance completely occurs or that the subsequently described event or circumstance occurs to a great extent or degree. For example, the term "substantially" means that the subsequently described event or circumstance occurs at least 90% of the time, or at least 95% of the time, or at least 98% of the time.

Where used herein, the term "IV-VI" refers to a compound or composition comprising at least one group IV element and at least one group VI element and is not intended to include a group V element unless inclusion of a group V element is explicitly indicated. Examples of Group IV elements include lead (Pb), tin (Sn), and germanium (Ge). Examples of Group VI elements include sulfur (S), selenium (Se), and tellurium (Te). Examples of Group III elements include aluminum (Al), gallium (Ga), and indium (In).

Where used herein, the acronym "TCBM" refers to a thermally conductive bonding material comprising a first phase material comprising a binding material, and a second phase material comprising a high thermal conductivity particulate material (HTCPM).

The presently disclosed concepts, having now been generally described, will be more readily understood by reference to the following examples and embodiments, which are included merely for purposes of illustration of certain aspects and embodiments of the presently disclosed inventive concepts, and are not intended to limit the presently disclosed inventive concepts. Without further elaboration, it is believed that one skilled in the art can, using the preceding description, practice the presently disclosed inventive concepts to the fullest extent. The following detailed examples and methods describe how to make and use the various compounds of the presently disclosed concepts and are to be construed, as noted above, only as illustrative, and not limitations of the preceding disclosure in any way whatsoever. Those skilled in the art will promptly recognize appropriate variations from the procedures.

Certain of the embodiments of the presently disclosed inventive concepts are directed to GaN HEMTs that are able to operate efficiently at higher power density levels than other transistor devices. In certain embodiments, ready-made high-power electronic devices such as transistors, HEMTs, and monolithic microwave integrated circuits (MMICs) may be packaged. In other novel embodiments, manufacturing methods are described that enable low-cost fabrication and packaging of these high-power devices such as GaN HEMTs. The novel GaN HEMTs presently disclosed have greater heat dissipation from hot spot regions inside the transistor structure as compared to prior GaN HEMTs, and have increased performance and significantly reduced manufacturing costs associated with their fabrication and packaging. It is anticipated that the novel GaN HEMTs described herein will experience greater and more widespread commercial adoption of GaN HEMT technology for a variety of existing and new applications. In two embodiments, for example, the novel GaN HEMTs can be used in high-frequency power amplifiers for microwave communications and radar applications, and in electronic circuitry products that handle high electrical power loads. For example, the presently disclosed technologies can be used in the deployment of "next generation" weather radar systems for more accurate warning of severe weather. For example, low-cost micro-radar systems based on the GaN HEMTs of the presently disclosed technologies will enable the affordable deployment of a high-density mesh network of weather radar stations. Currently, weather radar stations are often separated by more than 100 miles from each other. Low-cost micro-radar stations could be in much closer proximity to each other, for example, they could be placed on cell phone towers, which are typically spaced less than 5 miles from each other. Radar imaging of storm formation from multiple cell phone towers, which have their highest densities in populated regions where accurate severe weather warnings are needed most, will improve significantly our weather surveillance capabilities. Such a network is much more likely to provide critical data on the early formation stages of a tornado or large hailstorm. Thus, with the GaN HEMTs disclosed herein, atmospheric conditions that produce severe events can be monitored more precisely and more quickly resulting in fewer false alarms for severe weather and thus more lives saved during severe weather outbreaks.

The presently disclosed concepts solve the dual problems of (1) high substrate cost and (2) low thermal conductivity buffer layers of prior GaN HEMTs by decoupling the crystalline growth substrate, which is needed for good epitaxial layer growth, from the substrate material that supports the GaN epitaxial layer in the packaged HEMT product. This is accomplished in one embodiment by transferring the GaN-based epitaxial layer from the SiC crystalline growth substrate (which must be single crystalline) to another material that does not need to be a single crystalline material, i.e., to less expensive polycrystalline materials as the high thermal conductivity support substrate in the HEMT package. In addition to reducing HEMT manufacturing cost, this novel epitaxial layer transfer technology also enables elimination of low thermal conductivity buffer layers during or following growth substrate removal. The GaN HEMTs of the presently disclosed concepts are fabricated with at least one GaN-based epitaxial layer, which is defined herein as comprising GaN, and may comprise, in addition to the layer of GaN, a layer of AlGaN, and/or a layer of aluminum indium gallium nitride (AlInGaN). The latter may optionally include a layer of indium gallium nitride (InGaN). For example, an AlGaN/GaN HEMT is thus defined herein as a transistor structure containing at least one GaN layer and at least one AlGaN layer.

One embodiment of the presently disclosed concepts illustrated in FIG. 1 is a GaN-based HEMT structure (without a growth substrate). Source, gate, and drain contacts may be fabricated while the GaN-based epitaxial layer is still on the growth substrate material (prior to removal therefrom). The growth substrate can be, for example, SiC, sapphire, silicon, or GaN as discussed elsewhere herein. Sapphire is a thermally-resistive substrate, thus GaN-on-sapphire HEMTs do not exhibit reliable high-power operation. In some embodiments of the presently disclosed concepts, removal of the growth substrate as part of the final device packaging steps enables replacement of sapphire with a thermally conductive host substrate (also referred to elsewhere herein as a thermally conductive submount) having a much higher thermal conductivity than sapphire. In one embodiment as shown in FIG. 1, this thermally conductive host substrate (replacement material) comprises diamond, such as a chemical vapor deposited (CVD) diamond, a relatively low-cost high thermal conductivity material. Other thermally conductive host substrates which may be used herein in the final HEMT package include, but are not limited to, polycrystalline SiC, AlN, copper-tungsten, copper-diamond, combinations thereof, or any material that has high thermal conductivity (such, but not limited to, about 100 W/mK to about 400 W/mK) and a good coefficient of thermal expansion match with GaN (such as, but not limited to, about $5.0 \times 10^{-6}$ $K^{-1}$ to about $6.5 \times 10^{-6}$ $K^{-1}$). All of these potential replacement substrate materials are significantly less costly than single crystalline SiC growth substrates.

The GaN HEMT device of the embodiment of FIG. 1, described in more detail below, includes a thermally conductive interface layer (thermal interface layer) formed from a thermally conductive bonding material (TCBM) disposed between the GaN-based epitaxial layer and the thermally conductive host substrate. The thermally conductive interface layer (made from the TCBM) bonds the two components together. The TCBM in various embodiments can be composed of a variety of different materials or combinations of materials. In certain embodiments, the TCBM, which bonds the transferred epitaxial layer to the thermally conductive host substrate, is not electrically conductive (i.e., is electrically insulative) so that parasitic capacitances are not large. For example, the thermally conductive interface layer (formed from the thermally conductive bonding material) may have a resistivity in a range of about 1012 ohm-centimeter (cm) to about 1016 ohm-cm and a thermal conductivity in a range of about 5 W/mK to about 50 W/mk. In GaN HEMTs of radar and power electronics applications, which are operated at high frequencies, for parasitic RC time constants should be kept as small as possible. When the thermally conductive interface layer has a low thermal conductivity, in one embodiment, it is thin. In one embodiment, the TCBM comprises a thin layer of parylene, preferably less than 50 nm thick, or a parylene/particulate diamond composite material (as discussed in further detail below). In this embodiment, the GaN HEMT structure is absent a thermally resistive AlN buffer layer such as is typically used for GaN epitaxial layer growth. In this embodiment of the presently disclosed concepts wherein the GaN HEMT comprises a polycrystalline CVD diamond host substrate and a high thermally conductive interface layer, the GaN HEMT has performance which is greater relative to HEMTs on SiC substrates made using prior methods.

Figure 2:
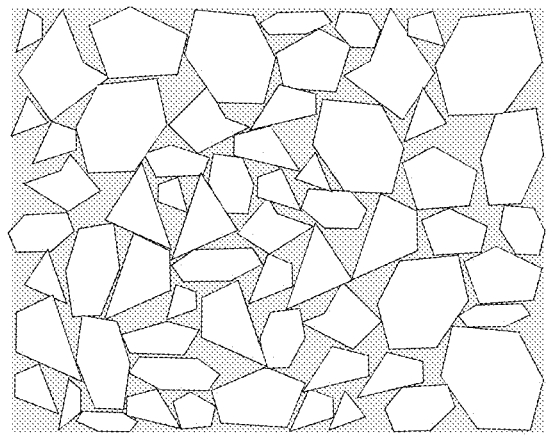
FIG. 2 is a cross-sectional view of a two-phase thermally conductive interface layer used in a GaN HEMT device constructed in accordance with the presently disclosed concepts.

In certain embodiments of the presently disclosed inventive concepts, in a method of fabricating the GaN HEMT structures, the TCBM used to form the thermally conductive interface layer comprises a composite material having at least two phases, including (1) a high thermal conductivity particulate material ("HTCPM") and (2) a binding material (also referred to herein and/or in the figures as a matrix material) that does not necessarily have a high thermal conductivity. For example, in one embodiment, the composite TCBM has a relatively high thermal conductivity that is much larger than the thermal conductivity of the binder material alone. FIG. 2 is a schematic depiction of such a two-phase composite material. The irregularly shaped features represent the HTCPM (such as, but not limited to, particulate CVD diamond, AlN, and beryllium oxide (BeO)), and the shaded region represents the binding (i.e., matrix) material (such as, but not limited to, parylene, benzocyclobutene, polyimide, sylgard, and silicone). Such a composite material can function as the high thermally conductive interface layer in the assembly of high heat load device structures (also referred to elsewhere herein as high power electronic devices) made from thin film semiconductor materials, such as are described herein.

EXAMPLE 1

Formation of a Thermally Conductive Interface Layer

Figure 3:
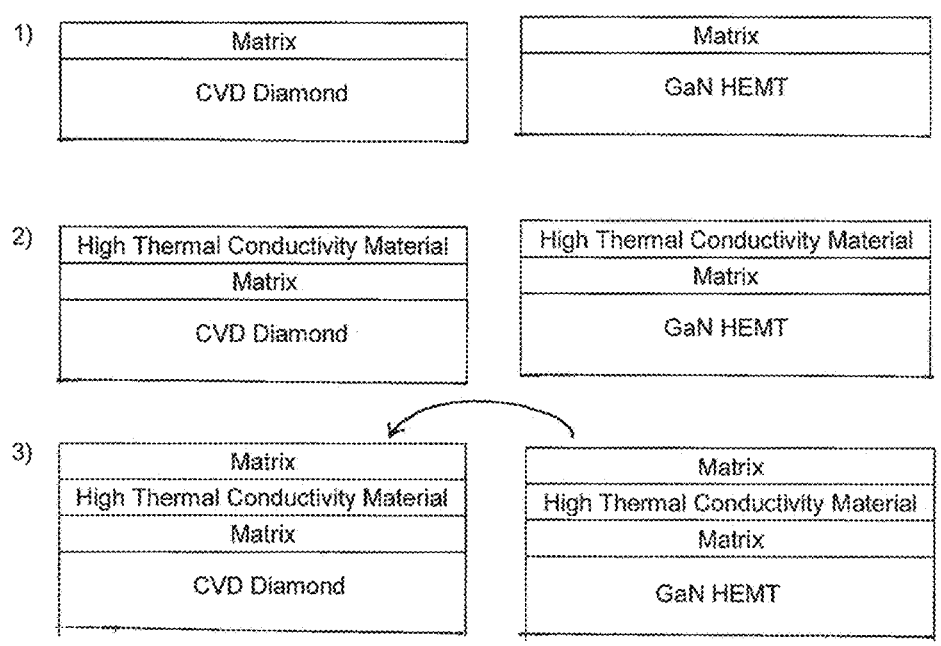
FIG. 3 is a cross-sectional schematic diagram of a sequence of processing steps for forming a thermally conductive interface layer material of a GaN HEMT device constructed in accordance with the presently disclosed inventive concepts.
Figure 4:
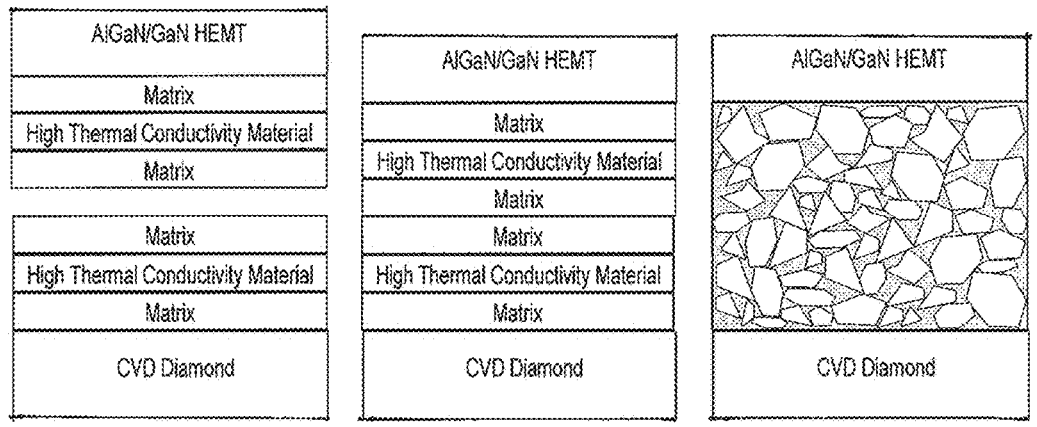
FIG. 4 is a cross-sectional schematic diagram representing (left) a GaN HEMT and host substrate, both coated with thermally conductive bonding material; (Center) mating of the two parts; and (right) the structure of the GaN HEMT after bonding at an elevated temperature.

One non-limiting embodiment of the fabrication of the high thermally conductive interface layer is shown in FIGS. 3 and 4. In this embodiment, the processing steps include, but are not limited to: (1) coating a surface of each part to be assembled with a thin layer of the binding material (also referred to elsewhere herein as "matrix") such as, but not limited to, parylene; (2) applying a quantity of the HTCPM (e.g., particulate CVD diamond) upon the binding material on each coated part; (3) applying a second coating of the binding material over the coating of the HTCPM (particulate material) on at least one or both of the parts; and (4) positioning the exposed binding material surfaces together and (as shown in FIG. 4) bonding the two parts together at an elevated temperature (e.g., 1500 degrees Celsius (° C.) to 3000° C.) with an applied force (such as, but not limited to, 50 pounds per square inch (psi)-75 psi) in a vacuum environment, wherein a GaN HEMT structure, for example, becomes connected to the thermally conductive host substrate via a high thermally conductive interface layer created by the combination of the layers of binding material and HTCPM. The thermally conductive interface layer can be relatively thick, such as from 50 nm up to or more than 10 micrometers (mm), to allow accommodation of topographical features as well as to absorb strain associated with thermal expansion mismatch between the transistor device material (i.e., the GaN epitaxial layer) and the heat sink material (i.e., the thermally conductive host substrate, e.g., CVD diamond). The thermally conductive interface layer that is formed between the two parts has a high thermal conductivity because of the proportionally large content of the HTCPM as compared to the binding material (matrix) in which the HTCPM is disposed.

EXAMPLE 2

Formation of a GaN HEMT Device Using Laser Lift Off

Figure 5:
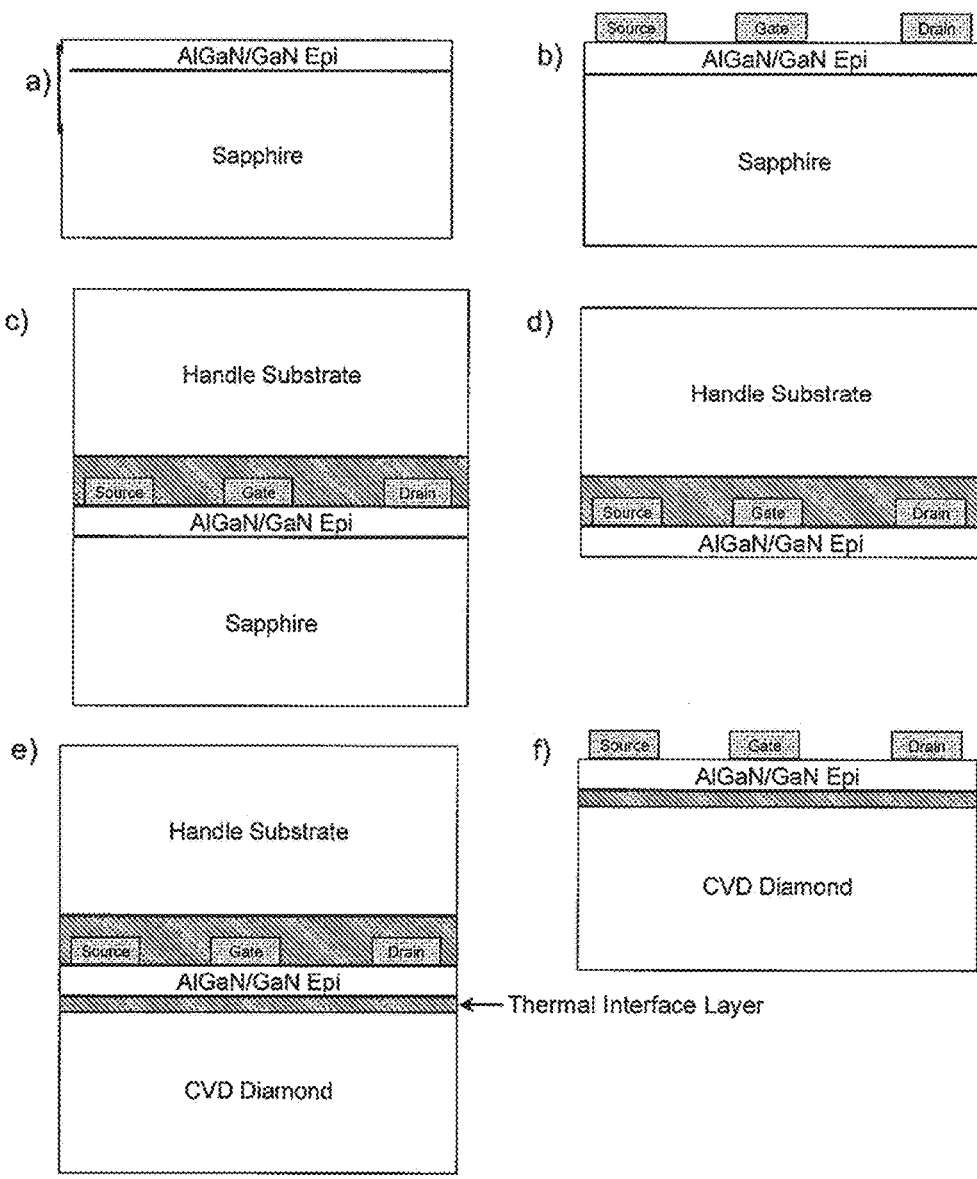
FIG. 5 is a schematic diagram representing a sequence of processing steps for fabricating and packaging a GaN HEMT, including: (a) epitaxial layer growth on a sapphire substrate; (b) HEMT fabrication, including formation of source, gate, and drain contacts; (c) handle substrate attachment; (d) growth substrate removal; (e) attachment of a high thermal conductivity host substrate; and (f) handle substrate removal.

In one embodiment of the presently disclosed inventive concepts, shown for example in step (a) of FIG. 5 (FIG. 5a), the fabrication and packaging of a GaN HEMT device begins with metal organic chemical vapor deposition (MOCVD) of a GaN (e.g., AlGaN/GaN) epitaxial transistor structure on a growth substrate, such as, but not limited to, sapphire, or any other growth substrate described herein or suitable for use in accordance with the presently described concepts. At step (b), standard transistor fabrication procedures well known to those of ordinary skill in the art to form source, gate, and drain metallic contacts are then performed when the GaN epitaxial layer structure is still on the growth substrate. The top of the GaN HEMT transistor structure is then bonded using a removable adhesive material (shown as cross-hatched in FIG. 5c) to a temporary handle substrate, which can be silicon or any other mechanically strong material with a relatively high thermal conductivity that can perform in accordance with the presently disclosed technologies. The removable adhesive material can be, for example, a chemically dissolvable material such as Brewer Science WaferBOND® CR-200. At step 5(d), the growth substrate (e.g., sapphire) is then removed, for example, by using the laser lift-off (LLO) technique. In one embodiment, the LLO method involves illumination of the GaN/sapphire interface through the transparent sapphire growth substrate with a krypton fluoride (KrF) excimer laser, which has a wavelength of 248 nm. U.S. Pat. No. 6,071,795 and U.S. Pat. No. 6,420,242 describe this LLO method and are each expressly incorporated by reference herein. Good thermal anchoring through a thermally conductive temporary handle substrate is useful since excimer laser illumination generates significant heat at the GaN/sapphire interface, and effective heat conduction away from this region will reduce the chance of thermally altering the fabricated transistor.

In one non-limiting embodiment, a wet chemical etch with hydrochloric acid (HCl) can be performed on the epitaxial layer after removal of the growth substrate removal to remove residual gallium metal following the LLO step of FIG. 5d. Alternatively, or in addition to wet chemical etching, a dry etching step using plasma or reactive ion etching methods can be used to remove III-V material from the exposed surface of the epitaxial layer. This material can include buffer layer material such as a thin layer of AlN that is commonly used to facilitate GaN epitaxial growth on sapphire. As discussed above, AlN layers can create large thermal resistances in packaged GaN HEMTs, so it can be helpful to remove this thermally resistive material. After cleaning the exposed surface of the GaN HEMT epitaxial layer, a bonding material, such as a TCBM, as described above, is applied to the exposed surface of the GaN HEMT epitaxial layer. The TCBM comprises a binding material such as an adhesive, such as, but not limited to, benzocyclobutene (BCB). The binding material can be applied, for example, by spin-coating onto the GaN HEMT epitaxial material and onto the thermally conductive host substrate (such as polycrystalline CVD diamond, or any other thermally conductive host substrate). At step 5(e), both parts are then mated together with applied mechanical pressure at an elevated temperature (e.g., ~150° C.) under vacuum conditions to form a thermally conductive interface layer between the two parts, thereby completing the attachment process. In one embodiment, the final thickness of the thermally conductive interface layer comprising the BCB is less than 50 nm thick.

In another embodiment, the binding material is parylene. In this case, the parylene polymer material can be applied using a vacuum deposition technique, which allows formation of contiguous films that are as thin as a few nanometers. Parylene is applied to both the GaN epitaxial material and the thermally conductive host substrate (such as polycrystalline CVD diamond). Both parts are then mated together with applied mechanical pressure at an elevated temperature (e.g., ~150° C.) under vacuum conditions to form a thermally conductive interface layer between the two parts, thereby completing the attachment process (also represented by FIG. 5e). The final thickness of this thermally conductive interface layer can be less than about 5 nm thick since the deposited parylene layers can be very thin.

In certain embodiments, the layer of binding material is kept thin, notably when the binding material has a low thermal conductivity, such as below 1.0 W/mK. Such a binding material, if it is thick, tends to create a large thermal resistance between the GaN HEMT active region and the thermally conductive substrate to which it is bonded. Thus, in certain embodiments of the presently disclosed technologies alternative to using simple single-phase binding materials as BCB or parylene, or a multi-phase TCBM as described elsewhere herein including, but not limited to: parylene and a HTCPM such as CVD diamond particles. In this case, the deposition process comprises multiple steps performed as described in Example 1. (e.g., see FIGS. 3 and 4 above). In two non-limiting embodiments, as noted in Example 1, application of the binding material can be by spin-coating, for example when using BCB, or by vacuum deposition, for example when using parylene.

Figure 6:
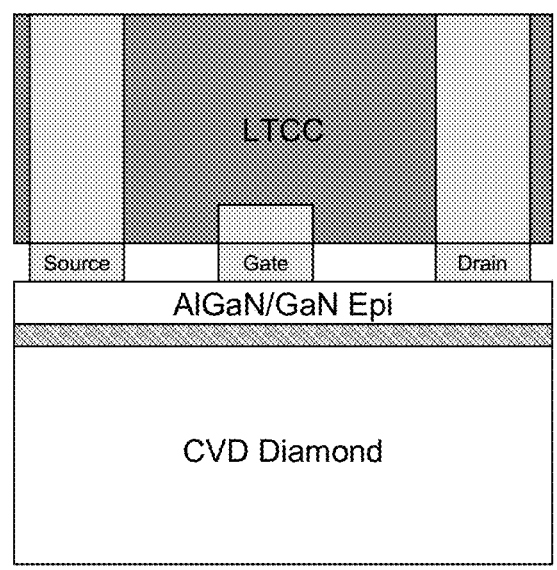
FIG. 6 is a schematic diagram showing a GaN HEMT package using flip-chip attachment to a low temperature co-fired ceramic (LTCC) circuit component.

At step 5(f), after the GaN HEMT device is attached (as in FIG. 5e) to a high thermal conductivity substrate such as, but not limited to, CVD diamond, the temporary handle substrate is removed, thus exposing the top side of the GaN HEMT device. Electrical contacts using standard wire bonding methods can then be made to the source, gate, and drain regions of the transistor. Alternatively, the GaN HEMT device can be flip-chip bonded to a submount containing the necessary electrical wiring for integration of the GaN HEMT into a circuit. In one embodiment, this submount can be an LTCC component, as indicated in FIG. 6, that can also assist in improving heat dissipation from the transistor hot spot regions. Flip-chip transistor packaging comprises the metallic contacts, which cover much larger areas than wire bonding packaging, allowing a greater flow of heat away from the source, gate, and drain regions.

In summary, this embodiment involves (1) growth of a GaN-based epitaxial layer on a growth substrate, (2) formation of metal contacts on the epitaxial layer, (3) attachment of a temporary handle to the epitaxial layer, (4) removal of the growth substrate, (5) application of a TCBM to the epitaxial layer and a thermal sink substrate which are then bonded together forming a thermal interface layer, and (6) removal of the temporary handle.

EXAMPLE 3

Formation of a GaN HEMT Using Flip Chip Bonding

In another embodiment of the presently disclosed concepts, fabrication and packaging of a GaN HEMT begins with metal organic chemical vapor deposition (MOCVD) of an AlGaN/GaN epitaxial transistor structure on a growth substrate such as a sapphire substrate, or any other growth substrate described herein or suitable for use in accordance with the presently described concepts. Standard transistor fabrication procedures to form the source, gate, and drain metallic contacts are then performed when the epitaxial layer structure is still on the growth substrate to form a transistor structure. The top surface of the transistor structure is then bonded to a circuit component that is part of the final packaging for the transistor. This circuit component can contain the wiring for interfacing the GaN HEMT to the system in which it is used. In one embodiment, the circuit component is an LTCC structure, which contains bonding pads for connecting the source, gate, and drain contacts of the GaN HEMT transistor structure. Conventional eutectic bonding metallurgy such as gold-tin (AuSn) can be used to attach the transistor structure to the LTCC circuit component. These connections, in addition to providing voltage and current access to the transistor structure, also allow heat to be dissipated from the top side of the GaN HEMT structure.

The growth substrate is then removed using the LLO technique. In one embodiment, the LLO method involves illumination of the GaN/substrate interface through the transparent substrate (e.g., sapphire) with a KrF excimer laser, which has a wavelength of 248 nm. U.S. Pat. Nos. 6,071,795 and 6,420,242 describe LLO methods, which can be employed. Good thermal anchoring through a thermally conductive circuit component mount is important since excimer laser illumination generates significant heat at the GaN/substrate interface, and effective heat conduction away from this region will reduce the chance of thermally altering the fabricated transistor.

As described above in Example 1, a wet chemical etch, a dry etch, or both can be used to remove residual materials from the exposed epitaxial layer surface. After cleaning the exposed bottom of the GaN HEMT structure, a binding material, such as a thermally conductive adhesive, is then applied as described above in Example 1. Further steps regarding applying a binding material to the parts and binding the parts together may be, but are not limited to, the same as those described above in Examples 1-2.

EXAMPLE 4

Formation of a GaN HEMT with Flip Chip Bonding and Substrate Removal by Polishing/Etching In an alternate embodiment, a GaN HEMT of the presently disclosed concepts can be fabricated by beginning with metal organic chemical vapor deposition (MOCVD) of an AlGaN/GaN epitaxial transistor structure on a substrate such as, but not limited to, silicon, or any other growth substrate described herein or suitable for use in accordance with the presently disclosed inventive concepts. Standard transistor fabrication procedures to form the source, gate, and drain metallic contacts are then performed where the epitaxial layer structure is still on the silicon growth substrate. The top surface of the GaN HEMT transistor structure is then bonded to a circuit component that is part of the final packaging for the transistor. This circuit component can contain the wiring for interfacing the GaN HEMT to the system in which it is used. As described above (see FIG. 6), an example of such a circuit component is an LTCC structure which contains bonding pads for connecting the source, gate, and drain contacts of the GaN HEMT device. As noted above, conventional eutectic bonding metallurgy such as gold-tin (AuSn) can be used to attach the transistor structure to the LTCC circuit component.

The growth substrate, e.g., silicon, is then removed by a combination of mechanical polishing and etching. Before exposing the flip-chip bonded assembly to a mechanical polishing slurry or chemical etchant, the sidewalls of the metallization that attaches the transistor structure to the circuit component can be protected. Deposition of a protectant, such as parylene in a vacuum system, enables uniform and continuous formation of a protective polymer layer even in very small spaces, and thereby can provide the necessary sidewall protection. In addition, the protectant seals the surfaces of the transistor structure and circuit component from attack by either the mechanical polishing slurry or the chemical etchant.

As noted in the non-limiting examples above, wet chemical etching, for example with a solution of equal parts of hydrofluoric acid (HF), nitric acid ($HNO_3$), and acetic acid ($CH_3COOH$), can be used to selectively remove the remaining growth substrate material, e.g., silicon, following the mechanical polishing step. The exposed bottom surface of the GaN HEMT structure is then coated with a TCBM in a manner such as shown in Examples 1 and 2. Both parts are then mated together with applied mechanical pressure at an elevated temperature under vacuum conditions to complete the attachment process as explained above.

EXAMPLE 5

Formation of a GaN HEMT Using a Soluble Release Layer

Figure 7:
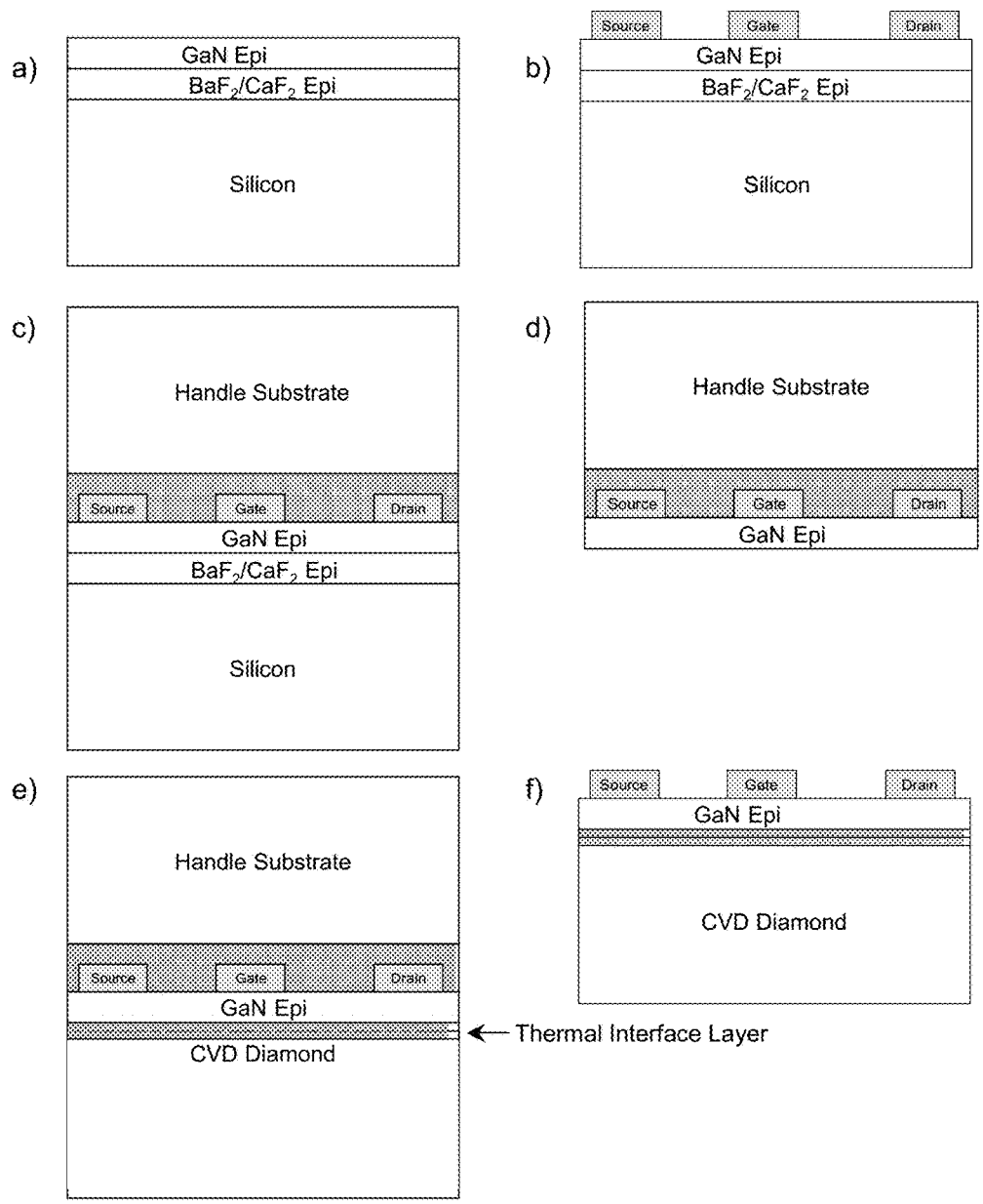
FIG. 7 is a schematic diagram showing a sequence of processing steps for fabricating and packaging a GaN HEMT, including: (a) epitaxial layer growth on a fluoride-coated silicon substrate; (b) HEMT fabrication, including formation of source, gate, and drain contacts; (c) handle substrate attachment; (d) growth substrate removal by dissolving a $BaF_2$ buffer layer; (e) attachment of a high thermal conductivity host substrate; and (f) handle substrate removal.

In another embodiment of the presently disclosed concepts (represented in FIG. 7), the fabrication of the GaN HEMT device begins with preparation of a growth substrate, such as but not limited to silicon, or any other growth substrate described herein or suitable for use in accordance with the presently described concepts, that has an epitaxial buffer layer structure (e.g., $BaF_2$ or $CaF_2$) designed to facilitate removal of the growth substrate. Established molecular beam epitaxy (MBE) growth techniques are available and allow formation of such structures. The MBE procedure begins in one embodiment with desorption of the native oxide on the substrate (e.g., silicon) by heating to a temperature between 850° C. and about 1050° C. under ultra-high vacuum (UHV) conditions. A thin (~2 nm) layer of epitaxial calcium fluoride ($CaF_2$) is then deposited after which a thicker layer (>30 nm) of epitaxial barium fluoride ($BaF_2$) is deposited. GaN (and/or AlGaN, or other GaN-based material) is then deposited directly on the epitaxial BaF$_2$ layer (FIG. 7a). This nitride deposition can be done in the same MBE chamber in which the fluoride materials are grown, or the fluoride-coated silicon wafers can be removed from the MBE chamber and placed in an MOCVD system for growth of the transistor material. Alternatively, the fluoride-coated silicon wafers can be placed in a pulsed electron deposition (PED) tool for lower temperature growth of a GaN layer. In certain embodiments, the complete GaN HEMT transistor structure can be grown in this PED tool, or the wafers can be transferred to an MOCVD system for this growth after a GaN seed layer is grown. The use of BaF$_2$ as a release layer upon which the gallium nitride epitaxial layer is grown is at least one novel step in this embodiment.

At step 7(b), standard transistor fabrication procedures to form the source, gate, and drain metallic contacts are then performed where the epitaxial layer structure is still on the growth substrate as discussed above. At step 7(c), the top of the GaN HEMT transistor structure is then bonded to a temporary handle substrate, which can be silicon or any other mechanically strong material with a relative high thermal conductivity, using a removable adhesive material also as discussed above. The adhesive material can be a chemically dissolvable material such as, but not limited to, Brewer Science WaferBOND® CR-200. At step 7(d), the growth substrate (e.g., silicon) is then removed by immersing the assembly in water to dissolve the water-soluble BaF$_2$ buffer layer material to provide the GaN HEMT structure with the handle thereon. After cleaning the exposed bottom surface of the GaN HEMT structure using techniques described above, a binding material such as a TCBM is then applied as described elsewhere herein. A number of options exist for this TCBM such as, but not limited to, those described above. At step 7(e), further steps for applying the TCBM to the GaN HEMT and thermal sink (host substrate) and bonding the two parts together may include, but are not limited to, those described above in Examples 1-2, wherein a thermally conductive interface layer (comprising the binding material and HTCPM of the TCBM) is formed between the GaN HEMT structure and the host substrate.

At step 7(f), after the GaN HEMT device is attached to a high thermal conductivity host substrate (such as but not limited to, polycrystalline CVD diamond), the temporary handle substrate is removed, thus revealing the top side of the GaN HEMT device. As described in examples above, electrical contacts using standard wire bonding methods can then be made to the source, gate, and drain regions of the GaN HEMT structure of FIG. 7f, or alternatively the structure can be flip-chip bonded to a submount containing the necessary electrical wiring for integration of the GaN HEMT into a circuit. FIG. 7 depicts one embodiment of a series of steps which can be used in implementing Example 5, wherein the growth substrate is silicon and the high thermally conductive host substrate is polycrystalline CVD diamond.

EXAMPLE 6

Formation of a GaN HEMT Using a Strain Absorbing Buffer Layer

Figure 8:
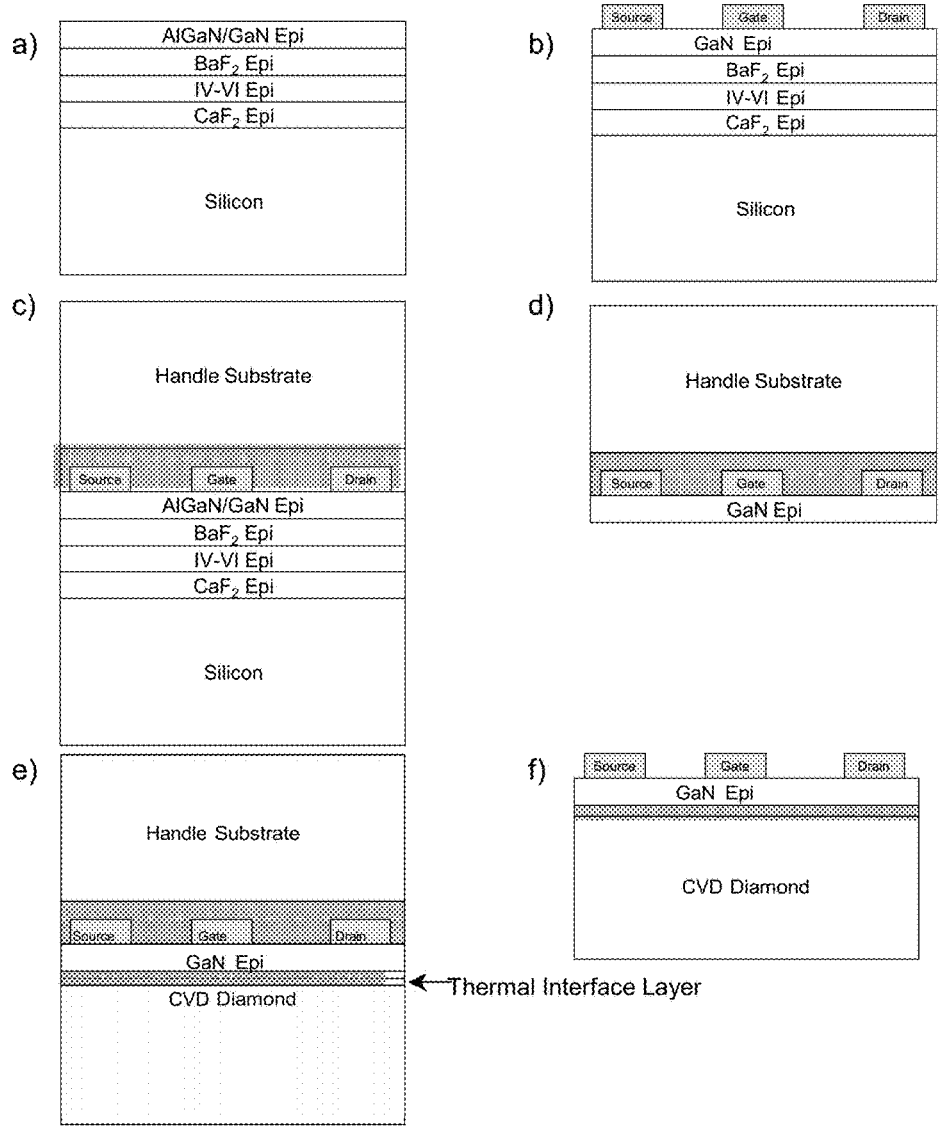
FIG. 8 is a schematic diagram showing a sequence of processing steps for fabricating and packaging a GaN HEMT device including: (a) epitaxial layer growth on a IV-VI/fluoride-coated silicon substrate; (b) HEMT fabrication, including formation of source, gate, and drain contacts; (c) handle substrate attachment; (d) growth substrate removal by dissolving the $BaF_2$ buffer layer; (e) attachment of a high thermal conductivity host substrate; and (f) handle substrate removal.

In another embodiment of the presently disclosed concepts, represented in FIG. 8, the fabrication of a GaN HEMT begins with preparation of a growth substrate (such as but not limited to, silicon, or any other growth substrate described herein or suitable for use in accordance with the presently described concepts) that has an epitaxial buffer layer structure designed to absorb strain and to allow removal of the growth substrate. Established molecular beam epitaxy (MBE) growth techniques are used. At step 8(a), the MBE procedure can begin with desorption of the native oxide on the growth substrate by heating to a temperature between 850° C. and about 1050° C. under ultrahigh vacuum (UHV) conditions. A thin (~2 nm) layer of epitaxial CaF$_2$ is then deposited on the growth substrate after which a thicker layer (e.g., >300 nm) of an epitaxial IV-VI semiconductor layer is deposited. This epitaxial IV-VI layer may be formed from any group IV-VI semiconductor material, including, but not limited to, semiconductor alloys having the formula PbY, PbXY, or PbYY, where Y is S, Se, or Te and X is Sn, Sr, Eu, or Cd, such as but not limited to PbSe, PbS, PbSnSe, PbTe, PbSnTe, PbSeTe, PbSrSe, PbSrTe, PbEuSe, PbEuTe, PbCdSe, PbCdTe, and any other alloy containing a combination of two, three, four, or more Group IV and Group VI elements. The IV-VI layer generally is a soft material that can plastically deform due to a dislocation glide mechanism that preserves crystalline quality. The IV-VI semiconductor layer therefore functions as a strain-relief layer to absorb the difference in thermal expansion coefficients between the growth (e.g., silicon) substrate and the GaN transistor material. An epitaxial layer of BaF$_2$ (e.g., >30 nm thick) is then deposited on the IV-VI-layer, for example, in the same MBE UHV chamber. GaN and/or AlGaN (or other GaN-based material) is then deposited directly on the epitaxial BaF$_2$ layer (FIG. 8). This nitride deposition can be done in the same MBE chamber in which the fluoride and IV-VI materials are grown, or the fluoride-IV-VI-coated substrates can be removed from the MBE chamber and placed in an MOCVD system for growth of the nitride transistor material. Alternatively, the MBE-prepared substrates can be placed in a pulsed electron deposition (PED) tool for lower temperature growth of a GaN layer. The complete GaN HEMT transistor structure can be grown in this PED tool, or the wafers can be transferred to an MOCVD system for this growth after a GaN seed layer is grown.

At step 8(b), standard transistor fabrication procedures to form the source, gate, and drain metallic contacts are then performed as described in the examples above. At step 8(c), the top of the transistor structure is then bonded in one embodiment via a removable adhesive to a temporary handle substrate, which can be silicon, for example, or any other mechanically strong material with a relative high thermal conductivity. At step 8(d), the growth substrate is then removed by immersing the assembly in water to dissolve the water-soluble CaF$_2$ and BaF$_2$ buffer layer material as discussed above to provide the GaN HEMT device with the temporary handle thereon. The exposed bottom surface of the GaN HEMT is then cleaned as discussed above.

At step 8(e), the GaN HEMT device with the temporary handle is then bonded to a high thermal conductivity substrate such as, but not limited to, CVD diamond in a process as discussed in the examples above to form a thermally conductive interface layer therebetween. At step 8(f), the temporary handle substrate is removed, thus revealing the top side of the GaN HEMT device. As described in examples above, electrical contacts using standard wire bonding methods can then be made to the source, gate, and drain regions of the GaN HEMT structure, or the structure can be flip-chip bonded to a submount containing the necessary electrical wiring for integration of the GaN HEMT into a circuit. FIG. 8 depicts one non-limiting embodiment of steps that can be used in implementing Example 6, wherein the growth substrate is silicon, the high thermal conductivity substrate is CVD diamond, and the epitaxial layer comprises AlGaN/GaN.

Figure 9:
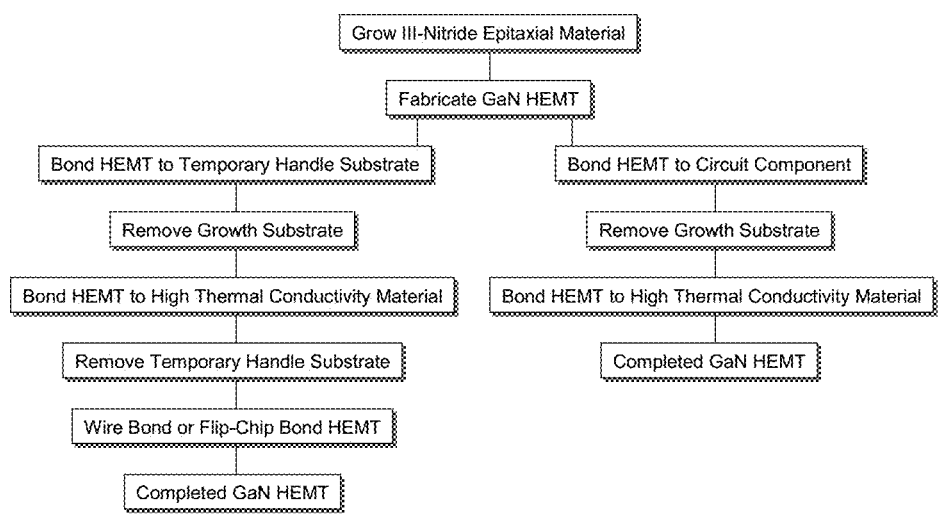
FIG. 9 is a flowchart representing two alternate embodiments for fabricating a Group III nitride (e.g., GaN) HEMT of the presently disclosed concepts.

Examples 1-6 described above exemplify certain non-limiting embodiments of processing steps that enable implementation of the presently disclosed inventive concepts. Basic transistor fabrication and packaging steps include, but are not limited to, epitaxial layer growth, transistor (GaN) fabrication, growth substrate removal, and epitaxial layer attachment to a thermally conductive host substrate. As illustrated in Examples 1-6, and in FIG. 9 discussed below, there are various ways to perform epitaxial layer growth, various ways to remove a growth substrate, and various ways to attach an epitaxial transistor material to a thermally conductive substrate. For example, FIG. 9 shows two alternate, but non-limiting, pathways for forming the GaN HEMTs of the presently disclosed concepts.

In the first alternate pathway (FIG. 9, leftmost pathway), a III-nitride (e.g., GaN) epitaxial layer is first formed on a growth substrate. Source, gates, and drains are then formed on the resulting epitaxial layer to form the transistor structure (HEMT). The GaN HEMT thus formed is bonded to a temporary handle substrate, the growth substrate is removed, the HEMT is bonded to a high thermally conductive host substrate via a TCBM to form a highly thermally conductive interface layer, the handle is removed, and the HEMT is wire-bonded or flip-chip bonded to circuitry, forming the completed GaN HEMT.

In the second alternate pathway (FIG. 9, rightmost pathway), a III-nitride (e.g., GaN) epitaxial layer is first formed on a growth substrate. Source, gates, and drains are then formed on the resulting epitaxial layer to form the transistor structure (HEMT). The GaN HEMT thus formed is directly bonded to a circuit component (i.e., no temporary handle is formed), the growth substrate is removed, then the HEMT is bonded to a high thermally conductive host substrate via a TCBM to form a highly thermally conductive interface layer, thereby forming the completed GaN HEMT. Examples of these steps are described above.

Moreover, there is flexibility in the order in which the processing steps are performed. As long as the process operates in accordance with the presently disclosed inventive concepts, the steps of each of these embodiments can be rearranged, interchanged and combined to create additional embodiments of methods of transistor fabrication and packaging. Overall, the result of the transistor manufacturing techniques disclosed here is a packaged GaN-based HEMT (e.g., an AlGaN/GaN HEMT). In certain embodiments, the GaN HEMTS have increased hot spot heat dissipation. In addition, the materials and methods disclosed here are suitable for low-cost manufacturing, enabling increased commercial acceptance in a variety of markets, such as but not limited to, next generation micro-radar systems and power electronics for electrical energy distribution. In alternate embodiments, described below, the presently disclosed concepts include high-power electronic devices having bilateral (two-sided) heat sinks, and methods of their manufacture, that enable higher power operation while maintaining low junction temperatures, thereby maintaining high reliability.

Optimizing Thermal Management of High-Power Electronic Devices

Unlike laser diode or light emitting diode (LED) packaging, bilateral (two-sided) heat sinking of power electronic devices (diodes, transistors, MMICs, etc.) requires a provision for making two or more electrical contacts to at least one side of the device. The presently disclosed concepts include embodiments of electronic devices made with multiple electrical contacts that can be attached to a high thermal conductivity circuit component. Described herein are methods of fabricating high thermal conductivity circuit components comprising metallic interconnects electrically isolated from each other by a thermally conductive interface layer constructed from a TCBM, such as but not limited to a polymer/particulate diamond bonding medium (as described elsewhere herein). The presently described structures have similarities to certain types of LTCC structures that are currently used to package electronic devices. In those examples of LTCC packaging, however, the electronic chip is physically separated from the LTCC material, resulting in minimal thermal transport (reducing thermal management) from the device side of the chip. Further, even if a solid material were to be placed between the chip and such a ceramic material (as was done with memory chips to reduce soft errors caused by alpha particles originating from the ceramic material), the low thermal conductivity of the ceramic material, which is less than 5 W/mK for alumina that is typically used, will not significantly enhance thermal management. The presently disclosed inventive concepts address and solve this shortcoming.

EXAMPLE 7

Flip-Chip Bonding to Circuit Components

Figure 10:
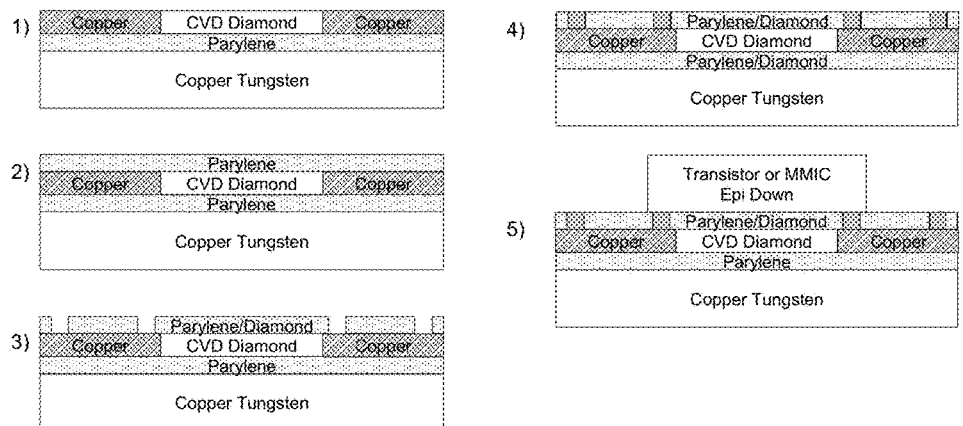
FIG. 10 is a schematic diagram showing a sequence of processing steps for fabricating and packaging a high thermal conductivity package with electrically insulated interconnects for high heat load chips. The cross-hatched areas labeled as "parylene" represent thermally conductive bonding materials made of, in this non-limiting embodiment, parylene and particulate chemical vapor deposition (CVD) diamond.

FIG. 10 illustrates an embodiment of a method of fabricating a high thermal conductivity submount for packaging high heat load chips. Step 10(1) comprises bonding a metal frame (any suitable metal frame materials used by persons of ordinary skill in the art such as, but not limited to, copper-lead, may be used) and a CVD diamond head to a thermally conductive submount plate (e.g., copper-tungsten) using a TCBM such as a parylene/particulate diamond material (e.g., as described above). Copper-tungsten is used in at least one embodiment as a submount material because of its good coefficient of thermal expansion (CTE) match with GaN. Examples of materials which could be used to make the submount plate include but are not limited to: CuW (e.g., 10% Cu, 90% W); CuMoCu (e.g., 30% Cu, 70% Mo); Cu/Mo/Cu (e.g., 1:1:1); Cu/CuMo/Cu (e.g., 1:4:1); alumina; Cu/Mo/Cu multilayers; and Al-diamond/Ag-diamond. Formation and deposition of the TCBM and the bonding procedure can be accomplished using the methods outlined in FIGS. 3 and 4. Step 10(2) comprises formation of a second TCBM layer over the metal frame and CVD diamond head bonded to the submount plate. The deposition of the binding material of the TCBM, e.g., parylene, in a low pressure chamber will allow this material to penetrate the small lateral gaps that will exist between the metallic frame and CVD diamond head materials. Step 10(3) comprises formation of contact vias through the TCBM layer. Standard photolithographic patterning and oxygen plasma etching can be used to accomplish this step, although any method which provides the same result can be used. In the case of etching a parylene/particulate diamond layer, there may be some residue of diamond dust that can be removed, for example by compressed dry nitrogen. Step 10(4) comprises selective deposition of eutectic metal contacts in the contact vias. This step can be performed by electroplating or by lift-off metallization or any other suitable method. In the case of lift-off metallization, the same photolithographic mask used to form the contact vias can be used to pattern negative photoresist before evaporation of the eutectic metal. Examples of eutectic metal alloys which can be used to form the contacts include but are not limited to AuSn, InSn, AuIn, CuSn, AuGe, AuSi, AlGe, AlSi, GaIn, and GaInSn. Step 10(5) comprises flip-chip bonding of the epitaxial side of a high heat load chip such as a HEMT or MMIC to the patterned submount. The eutectic metal contacts embedded in the TCBM layer in Step 4 allows electrical access outside of the chip perimeter. Traditional wire bonding can then be used for final circuit assembly. This novel electronic device packaging technology allows heat to be more effectively extracted from the device side of the high heat load chip.

In certain embodiments, the thicknesses of the metal frame and the CVD diamond materials are matched, and the thicknesses of the second TCBM layer and the deposited eutectic metals are matched. For example, the metal frame and CVD diamond head thicknesses can be controlled within a tolerance of about 2 µm or 0.0001 in. This can be done, for example, by specifying precise thickness for the vendors who may supply the CVD diamond material and the chemically-etched metal frame materials. The thicknesses of the TCBM layers can be in a range of about 4 µm (e.g., 2 µm each, e.g., comprising two 1 µm-thick depositions, on the mating parts), so a thickness mismatch of less than 2 µm can be accommodated since the binding material (e.g., parylene) of the TCBM will plastically deform at elevated bonding temperatures. The thicknesses of the second TCBM layer (e.g., parylene/diamond) and the deposited eutectic metals can both be controlled by deposition time with in situ quartz crystal microbalance deposition rate control. Non-limiting examples of thickness tolerances can be in a range of about 10 nm to about 250 nm (e.g., about 100 nm) for these deposition techniques.

Non-limiting examples of parylene that can be used in the TCBM include parylene-C, which has a melting point of 290° C., and parylene-N, which has a melting point of 420° C. Parylene-C is compatible with InSn eutectic metallization, which has a melting temperature of 120° C. Parylene-N is compatible with AuSn eutectic metallization, which has a melting temperature of 320° C. During the die-attach bonding step, the eutectic metal will be contained in the contact via wells defined by the etched parylene/diamond. For example, the parylene may not melt, yet is still allowed to deform plastically during this bonding step. The bonding temperature processing window for the parylene-C/InSn combination may be between about 130° C. and 280° C., while the processing window for the parylene-N/AuSn combination may be 330° C. to 410° C.

EXAMPLE 8

A Bilateral Heat Sink Electronic Device

Figure 11:
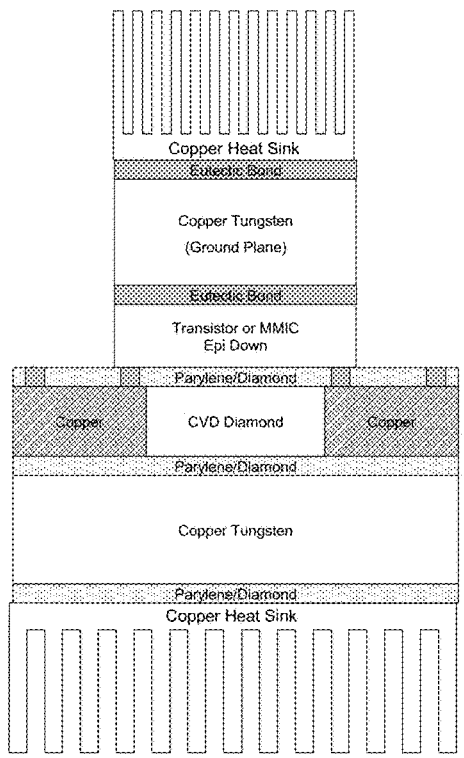
FIG. 11 is a cross-sectional schematic diagram representing an electronic device packaged using a method of the presently disclosed concepts and having a high thermal conductivity sub-mount containing electrical interconnects and finned heat sinks for air cooling.

FIG. 11 depicts an embodiment of a packaged high-power electronic device (e.g., a transistor, GaN HEMT, or MMIC) with bilateral heat sinks. Finned heat sinks for convective air cooling are shown in this depiction but any suitable type of heat sink could be used instead. In the case of a transistor such as an HEMT, the two wire bond contacts are the drain and gate contacts, while a source contact (or ground plane) is made through the backside of the chip.

A first metal eutectic bond on a top surface of a ground plate (which may be any type of thermally conductive submount material described herein, such as copper-tungsten) connects an upper heat sink to the ground plate and a second metal eutectic bond on a bottom surface of the ground plate connects the ground plate to a back side of the high power electronic device both thermally and electrically. In one embodiment, an InSn eutectic bonding material can be used for this when a higher melting temperature material such as AuSn is used in the contact vias. This process forms a heat sink-ground plate high-power electronic device package. A metal frame-CVD diamond head-submount having thermally conductive interface layer comprising TCBM and having eutectic contact vias (such as shown in Step (4) of FIG. 10) is then connected to the epitaxial side of the heat sink-ground plate high-power electronic device package in a manner similar to Step (5) in FIG. 10. A bottom heat sink is also bonded to the submount with a TCBM forming a thermally conductive interface layer, a bonding step that can also be performed at a sufficiently low temperature to prevent re-melting of contact via metallization. Any TCBM described herein which is able to form a suitable thermally conductive interface layer can be used, although parylene/particulate diamond is shown in the figures. The process results in a highly efficient bilateral heat sink high-power electronic device package.

Use of parylene/particulate diamond layers as a thermally conductive interface layer for attaching heat sinks to packaged electronic devices can offer many advantages over currently used techniques. For example, finite element thermal modeling of a composite parylene/particulate diamond material indicates that it can have a thermal conductivity of greater than 50 W/mK, which is much larger than the 2 W/mK thermal conductivities of commercially available thermal tape and thermal grease materials that are currently used for heat sink attachment. Moreover, thermal tapes and thermal grease materials are typically thicker than 50 µm, whereas a parylene/particulate diamond bond can be (but is not limited to) 10 µm or thinner. Overall, the presently described high thermally conductive materials and their methods of use offer many opportunities to improve significantly the thermal management of high-power electronic devices.

EXAMPLE 9

GaN Growth on Si for Low Cost Manufacturing

Figure 12:
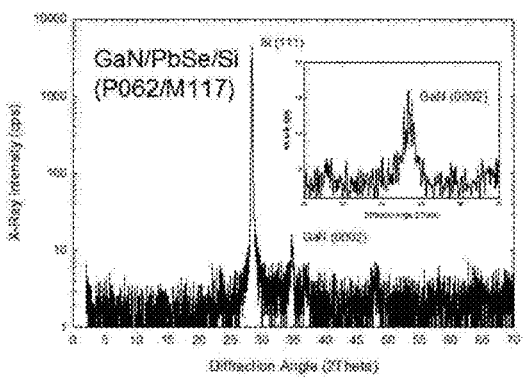
FIG. 12 is an X-ray diffraction rocking curve showing an epitaxial layer of GaN grown by pulsed electron deposition (PED) on lead selenide (PbSe) grown by molecular beam epitaxy (MBE) on an Si(111) substrate.
Figure 13:
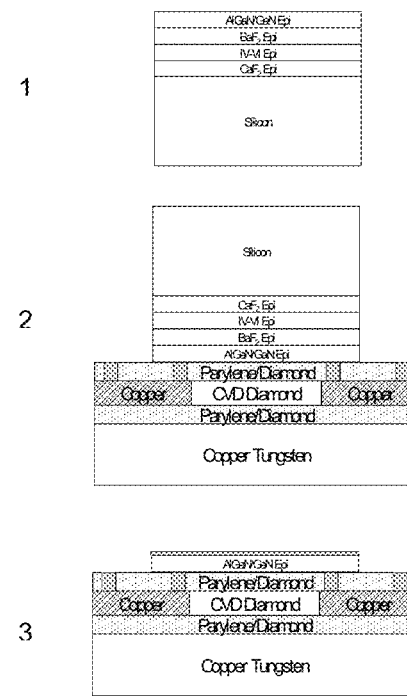
FIG. 13 is a schematic diagram showing a sequence of processing steps for fabricating and packaging an aluminum gallium nitride (AlGaN)/GaN HEMT in accordance with the presently disclosed inventive concepts including: (1) epitaxial layer growth of AlGaN/GaN on a IV-VI/fluoride-coated silicon substrate and HEMT fabrication, including formation of source, gate, and drain contacts; (2) flip-chip bonding to a high thermal conductivity submount with electrical interconnects; and (3) growth substrate removal by dissolving a $BaF_2$ buffer layer. Backside epitaxial layer metallization is also shown. This can be used to attach a high thermal conductivity copper-tungsten layer to form an electronic device such as the one depicted in FIG. 11.

Development of flip-chip packaging methods for high-power electronic devices opens up additional opportunities to address the high manufacturing costs associated with GaN-based devices, for example in regard to growing epitaxial layers on industry-standard silicon substrates. A motivation for this work has been the recognition that growth on silicon allows low-cost manufacturing since the large industrial infrastructure built around silicon materials technologies is readily available for any new electronic or optoelectronic device material that can be grown on silicon. FIG. 12 provides results showing that it is possible to combine molecular beam epitaxy (MBE) and pulsed electron deposition (PED) growth methods to obtain epitaxial layers on GaN on Si with IV-VI semiconductor buffer layers. One non-limiting embodiment of epitaxial layer growth, flip-chip bonding, substrate removal, and packaging of lower cost GaN HEMTs is shown in FIG. 13.

At step 13(1), fabrication can begin with preparation of a silicon growth substrate that has an epitaxial buffer layer structure designed to absorb strain and to allow removal of the silicon growth substrate. In this case, following native oxide desorption, a thin (e.g., about ~2 nm) layer of epitaxial $CaF_2$ is deposited, after which a thicker layer (e.g., >300 nm) of an epitaxial IV-VI semiconductor layer is deposited. This IV-VI layer, which can be binary PbSe or a pseudobinary alloy of PbSeTe, PbSnSe, PbSrSe, or other related material discussed elsewhere herein, is a soft material that can plastically deform due to a dislocation glide mechanism that preserves crystalline quality. It can therefore function as a strain-relief layer to absorb the difference in thermal expansion coefficients between the silicon growth substrate and the GaN device material. A layer of epitaxial $BaF_2$ (>30 nm thick) is then grown in the same MBE chamber. GaN is then deposited directly on the epitaxial $BaF_2$ layer. This $BaF_2$ layer, which is water soluble, can serve as a growth substrate release layer during the device packaging procedure. Nitride deposition can be done in an appropriately configured MBE chamber, or the fluoride-IV-VI-coated silicon wafers can be removed from the MBE chamber and placed in a separate GaN deposition tool, as was done for the sample in FIG. 12. MBE-prepared silicon wafers can thus be used for growth of AlGaN/GaN HEMT transistor structures, for example.

Following nitride device structure growth, standard device fabrication procedures to form the source, gate, and drain metallic contacts can be performed. Polymer coating of the wafer perimeter will be needed prior to wet processing (i.e., photolithography) to prevent $BaF_2$ dissolution and premature separation of the growth substrate from the epitaxial device material. At step 13(2), flip-chip bonding to the thermally conductive circuit component submount is done as described above (FIG. 10). At step 13(3), the silicon growth substrate, along with the IV-VI semiconductor buffer layer, is then removed by immersing the bonded assembly in water to dissolve the water-soluble $BaF_2$ release layer material. This leaves the thin film nitride device material (e.g., AlGaN/GaN) attached with electrical connections to a high thermal conductivity submount. A second heat sink can then be bonded to the exposed backside of the epitaxial device material as shown in FIG. 11. A final packaged device similar to that depicted in FIG. 11 is thus produced. In this case, though, a growth substrate is absent in the final package, and a low-cost high thermal conductivity material such as copper-tungsten (or other suitable material) can be used to replace it. By eliminating the need for an expensive single-crystalline SiC growth substrate material to be left in the final packaged product, the growth substrate can be used again. This combination of growth and packaging technologies enables low-cost manufacturing of high-power GaN-based electronic devices.

In at least one embodiment, the presently disclosed concepts are directed to a high-power electronic device package including a thermally conductive submount having an upper surface and a lower surface, a first thermally conductive interface layer disposed on the upper surface of the thermally conductive submount, a metal frame and a diamond head bonded to the upper surface of the thermally conductive submount via the first thermally conductive interface layer, a second thermally conductive interface layer disposed on the metal frame and diamond head, at least one eutectic metal contact formed in at least one via in the second thermally conductive interface layer, and a high-power electronic device having an epitaxial surface, wherein the epitaxial surface of the high power electronic device is in contact with the at least one eutectic metal contact and is secured thereto and to the thermally conductive submount by the second thermally conductive interface layer.

The high-power electronic device package may include a ground plate bonded to a second surface of the high-power electronic device via a eutectic metal bonding layer. The high-power electronic device package may include a heat sink bonded to the ground plate by a second eutectic metal bonding layer. The high-power electronic device package may include a heat sink bonded to a lower surface of the thermally conductive submount by a third thermally conductive interface layer. The high-power electronic device package may include a ground plate bonded to a second surface of the high-power electronic device via a eutectic metal bonding layer and a heat sink bonded to the ground plate by a second eutectic metal bonding layer. The high-power electronic device package may include a ground plate bonded to a second surface of the high-power electronic device via a eutectic metal bonding layer, a first heat sink bonded to the ground plate by a second eutectic metal bonding layer, and a second heat sink bonded to a lower surface of the thermally conductive submount by a third thermally conductive interface layer. The high-power electronic device of the high-power electronic device package may be a transistor, an HEMT, or a monolithic microwave integrated circuit (MMIC). The HEMT of the high-power electronic device package may include GaN. The thermally conductive interface layers of the high-power electronic device package may include thermally conductive bonding materials comprising a first phase material including a binding material, and a second phase material including a high thermal conductivity particulate material (HTCPM). The binding material of the high-power electronic device package may include at least one of parylene, benzocyclobutene, polyimide, sylgard, and silicone, and combinations thereof, and the HTCPM may include at least one of particulate diamond, AlN, and BeO, and combinations thereof. The thermally conductive submount of the high-power electronic device package may include at least one of CuW, CuMoCu, Cu/Mo/Cu, Cu/CuMo/Cu, alumina, Cu/Mo/Cu multilayers, and Al-diamond/Ag-diamond.

In another embodiment, the presently disclosed concepts are directed to an epitaxial GaN layer structure constructed of a growth substrate comprising an epitaxial $CaF_2$ layer formed on an upper surface thereof, an epitaxial IV-VI semiconductor layer disposed on the epitaxial $CaF_2$ layer, a $BaF_2$ release layer disposed on the epitaxial IV-VI semiconductor layer, and an epitaxial GaN layer disposed on the $BaF_2$ release layer. The epitaxial GaN layer structure may further include an epitaxial AlGaN layer.

In another embodiment, the presently disclosed concepts are directed to a method of packaging a high-power electronic device including the steps of: (1) applying a thermally conductive bonding material (TCBM) to an upper surface of a thermally conductive submount; (2) disposing a metal frame and a diamond head upon the TCBM on the upper surface of the thermally conductive submount and causing the metal frame and diamond head to be bonded to the thermally conductive submount; (3) disposing a second layer of TCBM upon the metal frame and diamond head bonded to the thermally conductive submount, forming at least one via in the second layer of TCBM; (4) applying a eutectic metal in the at least one via to form at least one eutectic metal contact therein; and (5) disposing a high-power electronic device having an epitaxial surface upon the second layer of TCBM, wherein the epitaxial surface is in contact with the at least one eutectic metal contact, and causing the high-power electronic device to be secured thereto and to the thermally conductive submount, forming a high-power electronic device package.

The method may include a step of applying a eutectic metal bonding layer to a second surface of the high-power electronic device and bonding a ground plate to the second surface of the high-power electronic device via the eutectic metal bonding layer. The method may include a step of applying a second eutectic metal bonding layer to an exposed surface of the ground plate and bonding a heat sink to the exposed surface of the ground plate via the second eutectic metal bonding layer. The method may include a step of applying a third layer of TCBM to a lower surface of the thermally conductive submount and bonding a heat sink to the lower surface of the thermally conductive submount via the third layer of TCBM. The method may include a step of applying a first eutectic metal bonding layer to a second surface of the high-power electronic device and bonding a ground plate to the second surface of the high-power electronic device via the eutectic metal bonding layer, and applying a second eutectic metal bonding layer to an exposed surface of the ground plate and bonding a heat sink to the exposed surface of the ground plate via the second eutectic metal bonding layer. The method may include (1) applying a first eutectic metal bonding layer to a second surface of the high-power electronic device and bonding a ground plate to the second surface of the high-power electronic device via the eutectic metal bonding layer; (2) applying a second eutectic metal bonding layer to an exposed surface of the ground plate and bonding a first heat sink to the exposed surface of the ground plate via the second eutectic metal bonding layer; and (3) applying a third layer of TCBM to a lower surface of the thermally conductive submount and bonding a second heat sink to the lower surface of the thermally conductive submount via the third layer of TCBM, forming a bilateral heat sink-high power electronic device package.

The high-power electronic device used in the method may be a transistor, an HEMT, or a monolithic microwave integrated circuit (MMIC). The HEMT may comprise GaN. The high-power electronic device of the method may have an epitaxial GaN layer structure, comprising a growth substrate including an epitaxial $CaF_2$ layer formed on an upper surface thereof, an epitaxial IV-VI semiconductor layer disposed on the epitaxial $CaF_2$ layer, a $BaF_2$ release layer disposed on the epitaxial IV-VI semiconductor layer, and an epitaxial GaN layer disposed on the $BaF_2$ release layer. The method may include a step of removing the growth substrate by dissolution of the $BaF_2$ release layer. The TCBM may include a first phase material comprising a binding material, and a second phase material comprising a high thermal conductivity particulate material (HTCPM). The binding material used in the method may include at least one of parylene, benzocyclobutene, polyimide, sylgard, and silicone, and combinations thereof, and the HTCPM may include at least one of particulate diamond, AlN, and BeO, and combinations thereof. The thermally conductive submount used in the method may be constructed of at least one of CuW, CuMoCu, Cu/Mo/Cu, Cu/CuMo/Cu, alumina, Cu/Mo/Cu multilayers, and Al-diamond/Ag-diamond, or combinations thereof.

In another embodiment, the presently disclosed concepts are directed to a method of fabricating a GaN epitaxial layer structure, including the steps of: (1) forming an epitaxial $CaF_2$ layer on a growth substrate, (2) forming an epitaxial IV-VI semiconductor layer on the epitaxial $CaF_2$ layer, (3) forming a $BaF_2$ release layer on the epitaxial IV-VI semiconductor layer, and (4) forming an epitaxial GaN layer on the $BaF_2$ release layer.

In another embodiment, the presently disclosed concepts are directed to a method of fabricating a GaN HEMT, including the steps of: (1) forming a GaN epitaxial layer on a growth substrate, the GaN epitaxial layer having an exposed upper surface; (2) fabricating at least one ohmic contact on the exposed upper surface of the GaN epitaxial layer to form a GaN transistor structure having an upper surface and a lower surface; (3) removing the GaN transistor structure from the growth substrate, whereby the lower surface of the GaN transistor structure is exposed; (4) applying a thermally conductive bonding material (TCBM) to the lower surface of the GaN transistor structure, forming a transistor bonding surface thereon; (5) providing a thermally conductive host substrate having a first surface and a second surface, the first surface having a layer of the TCBM disposed thereon, forming a host substrate bonding surface thereon; (6) disposing the GaN transistor structure onto the thermally conductive host substrate such that the transistor bonding surface is positioned on the host substrate bonding surface; and (7) bonding the GaN transistor structure to the thermally conductive host substrate, thereby forming a thermally conductive interface layer between the GaN transistor structure and the thermally conductive host substrate.

In the method, the growth substrate may be selected from the group consisting of sapphire, silicon, silicon carbide (SiC), and GaN. The thermally conductive host substrate may be selected from the group consisting of diamond, SiC, aluminum nitride (AlN), copper-tungsten, copper-diamond, and combinations thereof. The at least one ohmic contact may be selected from the group consisting of gates, drains, and sources. The step of forming a GaN epitaxial layer on a growth substrate may be performed at a temperature in a range of about 850° C.) to about 1050° C. The TCBM may include a first phase material comprising a binding material and a second phase material comprising a high thermal conductivity particulate material (HTCPM). The TCBM may have a thermal conductivity of at least about 2 W/mK. The TCBM may have a thermal conductivity in a range of at least about 5 W/mK to about 50 W/mK. The thermally conductive interface layer may have a thickness in a range of about 50 nm to about 10 µm. The binding material may be a polymeric bonding material. The polymeric bonding material may include at least one of parylene, benzocyclobutene, polyimide, sylgard, and silicone, or combinations thereof. The HTCPM may include at least one of diamond, AlN, and BeO, or combinations thereof. In the step of applying the TCBM to the lower surface of the GaN transistor structure, a layer of the first phase material may be applied, followed by a layer of the second phase material, followed by a second layer of the first phase material. The step of bonding the GaN transistor to the thermally conductive host substrate may be performed at a temperature in a range of about 150° C. to about 300° C. The GaN epitaxial layer may further comprise a layer of at least one of AlGaN, InGaN, and AlInGaN. The method may further include a step of applying a removable handle substrate to the upper surface of the GaN transistor structure before the step of removing the GaN transistor structure from the growth substrate. The method may further include a step of removing the removable handle substrate after the step of bonding the GaN transistor structure to the thermally conductive host substrate. The step of removing the GaN transistor structure from the growth substrate may be conducted by an LLO process. The method may further include a step of connecting the GaN transistor structure to a circuit component to form a GaN HEMT circuit structure. The GaN transistor structure may be connected to the circuit component via a flip-chip attachment process. The circuit component may be an LTCC component. The growth substrate may be provided with (1) a layer of $CaF_2$ deposited thereon, and (2) a layer of $BaF_2$ deposited on the layer of $CaF_2$, wherein the GaN epitaxial layer is formed upon the layer of $BaF_2$. The step of removing the GaN transistor structure from the growth substrate may be conducted by dissolution of the layer of $BaF_2$. The layer of $CaF_2$ may have a thickness in a range of about 1 nm to about 3 nm. The layer of $BaF_2$ may have a thickness in a range of about 30 nm to about 300 nm. The layer of IV-VI semiconductor material may have a thickness in a range of about 2 µm to about 5 µm.

In another embodiment, the presently disclosed concepts are directed to a GaN HEMT, including a transistor structure comprising a GaN thin film layer bonded to a thermally conductive host substrate via a thermally conductive interface layer disposed therebetween, wherein the thermally conductive interface layer is electrically insulative and has a high thermal conductivity. The thermally conductive host substrate may be selected from the group consisting of diamond, SiC, aluminum nitride (AlN), copper-tungsten, copper-diamond, and combinations thereof. The GaN HEMT may include at least one ohmic contact selected from the group consisting of gates, drains, and sources. The thermally conductive interface layer may have a resistivity in a range of about $10^{12}$ ohm-cm to about $10^{16}$ ohm-cm. The thermally conductive interface layer may have a thickness in a range of about 50 nm to about 10 µm. The thermally conductive interface layer may be a thermally conductive bonding material (TCBM) including a first phase material comprising a binding material, and a second phase material comprising a high thermal conductivity particulate material (HTCPM). The TCBM may have a thermal conductivity of at least about 2 W/mK. The TCBM may have a thermal conductivity in a range of at least about 5 W/mK to about 50 W/mK. The binding material may include at least one of parylene, benzocyclobutene, polyimide, sylgard, and silicone, and combinations thereof. The HTCPM may include at least one of diamond, AlN, and BeO, and combinations thereof. The GaN thin film layer may include a layer of at least one of AlGaN, InGaN, and AlInGaN. The GaN HEMT may be connected to a circuit component to form a GaN HEMT circuit structure. The circuit component may be an LTCC component.

Although the presently described concepts and the advantages thereof have been described in detail, it should be understood that various changes, substitutions, and alterations can be made herein without departing from the spirit and scope of the presently described concepts as defined in the appended claims. Moreover, the scope of the presently described concepts is not intended to be limited to the particular embodiments of the process, items of manufacture, compositions of matter, means, methods, and steps described in the specification or appended claims. As one of ordinary skill in the art will readily appreciate from the present disclosure, processes, items of manufacture, compositions of matter, means, methods, or steps, presently existing or later to be developed that perform substantially the same function or achieve substantially the same result as the corresponding embodiments described herein may be utilized according to the presently described concepts. Accordingly, the appended claims are intended to include within their scope such processes, items of manufacture, compositions of matter, means, methods, or steps.

What is claimed is:

1. A method of packaging a high-power electronic device, comprising:
    applying a first thermally conductive bonding material (TCBM) layer to an upper surface of a thermally conductive submount;
    disposing a metal frame and a diamond head upon the first TCBM layer;
    bonding the metal frame and the diamond head to the thermally conductive submount;
    disposing a second TCBM layer upon the metal frame and the diamond head;
    forming at least one via in the second TCBM layer;
    applying a eutectic metal in the at least one via to form at least one eutectic metal contact therein;
    disposing on the second TCBM layer the high-power electronic device having an epitaxial surface so that the epitaxial surface is in contact with the at least one eutectic metal contact; and
    securing the high-power electronic device to the at least one eutectic metal contact and to the thermally conductive submount to form a high-power electronic device package.

2. The method of claim 1, further comprising:
    applying a first eutectic metal bonding layer to a second surface of the high-power electronic device; and
    bonding a ground plate to the second surface of the high-power electronic device via the first eutectic metal bonding layer.

3. The method of claim 2, further comprising:
    applying a second eutectic metal bonding layer to an exposed surface of the ground plate; and
    bonding a heat sink to the exposed surface of the ground plate via the second eutectic metal bonding layer.

4. The method of claim 1, further comprising:
    applying a third TCBM layer to a lower surface of the thermally conductive submount; and
    bonding a heat sink to the lower surface of the thermally conductive submount via the third TCBM layer.

5. The method of claim 1, further comprising:
    applying a first eutectic metal bonding layer to a second surface of the high-power electronic device;
    bonding a ground plate to the second surface of the high-power electronic device via the first eutectic metal bonding layer;
    applying a second eutectic metal bonding layer to an exposed surface of the ground plate; and
    bonding a heat sink to the exposed surface of the ground plate via the second eutectic metal bonding layer.

6. The method of claim 1, further comprising:
    applying a first eutectic metal bonding layer to a second surface of the high-power electronic device;
    bonding a ground plate to the second surface of the high-power electronic device via the first eutectic metal bonding layer;
    applying a second eutectic metal bonding layer to an exposed surface of the ground plate; and
    bonding a first heat sink to the exposed surface of the ground plate via the second eutectic metal bonding layer;
    applying a third TCBM layer to a lower surface of the thermally conductive submount; and
    bonding a second heat sink to the lower surface of the thermally conductive submount via the third TCBM layer to form a bilateral heat sink and high-power electronic device package.

7. The method of claim 1, wherein the high-power electronic device is a transistor, a high-electron-mobility transistor (HEMT), or a monolithic microwave integrated circuit (MMIC).

8. The method of claim 7, wherein the HEMT comprises gallium nitride (GaN).

9. The method of claim 1, wherein the high-power electronic device comprises an epitaxial gallium nitride (GaN) layer structure comprising:
    a growth substrate comprising an epitaxial $CaF_2$ layer formed on an upper surface of the growth substrate;
    an epitaxial IV-VI semiconductor layer disposed on the epitaxial $CaF_2$ layer;

a BaF$_2$ release layer disposed on the epitaxial IV-VI semiconductor layer; and an epitaxial GaN layer disposed on the BaF$_2$ release layer.

10. The method of claim 9, further comprising removing the growth substrate by dissolution of the BaF$_2$ release layer.

11. The method of claim 1, wherein the first TCBM layer comprises a first phase material and a second phase material, wherein the first phase material comprises a binding material, and wherein the second phase material comprises a high thermal conductivity particulate material (HTCPM).

12. The method of claim 11, wherein the binding material comprises at least one of parylene, benzocyclobutene, polyimide, sylgard, silicone, and combinations thereof, and wherein the HTCPM comprises at least one of particulate diamond, AlN, BeO, and combinations thereof.

13. The method of claim 1, wherein the thermally conductive submount comprises at least one of CuW, CuMoCu, Cu/Mo/Cu, Cu/CuMo/Cu, alumina, Cu/Mo/Cu multilayers, and Al-diamond/Ag-diamond.

* * * * *